US006532163B2

(12) United States Patent
Okazawa (10) Patent No.: US 6,532,163 B2
(45) Date of Patent: Mar. 11, 2003

(54) NON-VOLATILE SEMICONDUCTOR MEMORY DEVICE WITH MAGNETIC MEMORY CELL ARRAY

(75) Inventor: Takeshi Okazawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/954,267

(22) Filed: Sep. 18, 2001

(65) Prior Publication Data

US 2002/0034117 A1 Mar. 21, 2002

(30) Foreign Application Priority Data

Sep. 19, 2000 (JP) ........................................ 2000-283162

(51) Int. Cl.[7] .............................................. G11C 11/15
(52) U.S. Cl. ........................... 365/97; 365/99; 365/171; 365/158; 365/173; 365/66; 365/230.03
(58) Field of Search .............................. 365/66, 97, 99, 365/158, 171, 173, 63, 230.03

(56) References Cited

U.S. PATENT DOCUMENTS 5,894,447 A * 4/1999 Takashima ................... 365/158
6,144,583 A * 11/2000 Shiba ........................ 365/185.13
6,297,985 B1 * 10/2001 Kang ............................ 365/145
6,339,549 B1 * 1/2002 Jinbo et al. ................ 365/185.33
6,349,054 B1 * 2/2002 Hidaka ........................ 365/173
6,356,476 B1 * 3/2002 Kang ............................ 365/145
2002/0054500 A1 * 5/2002 Yamada ......................... 365/97

* cited by examiner

Primary Examiner—Viet Q. Nguyen
(74) Attorney, Agent, or Firm—McGinn & Gibb, PLLC

(57) ABSTRACT

The present invention provides a memory cell array structure comprising: a plurality of cell array blocks aligned in matrix in both the row and column directions, and each of the cell array blocks including a plurality of magnetic memory cells; a plurality of main word lines being connected through sub-word switching devices to the same number of sub-word lines as a first number of the cell array blocks aligned in the row direction, and each of the sub-word lines being connected to at least one of the magnetic memory cells; and a plurality of main bit lines being connected through sub-bit switching devices to the same number of sub-bit lines as a second number of the cell array blocks aligned in the column direction, and each of the sub-bit lines being connected to at least one of the magnetic memory cells.

24 Claims, 9 Drawing Sheets

FIG. 1C   prior art data "0"

data "1"

NON-VOLATILE SEMICONDUCTOR MEMORY DEVICE WITH MAGNETIC MEMORY CELL ARRAY

BACKGROUND OF THE INVENTION

1. Field of the Invention

The present invention relates to a non-volatile semiconductor memory device, and more particularly to a magnetic random access memory device having an array of magnetic memory cells.

2. Description of the Related Art

Figure 1A:
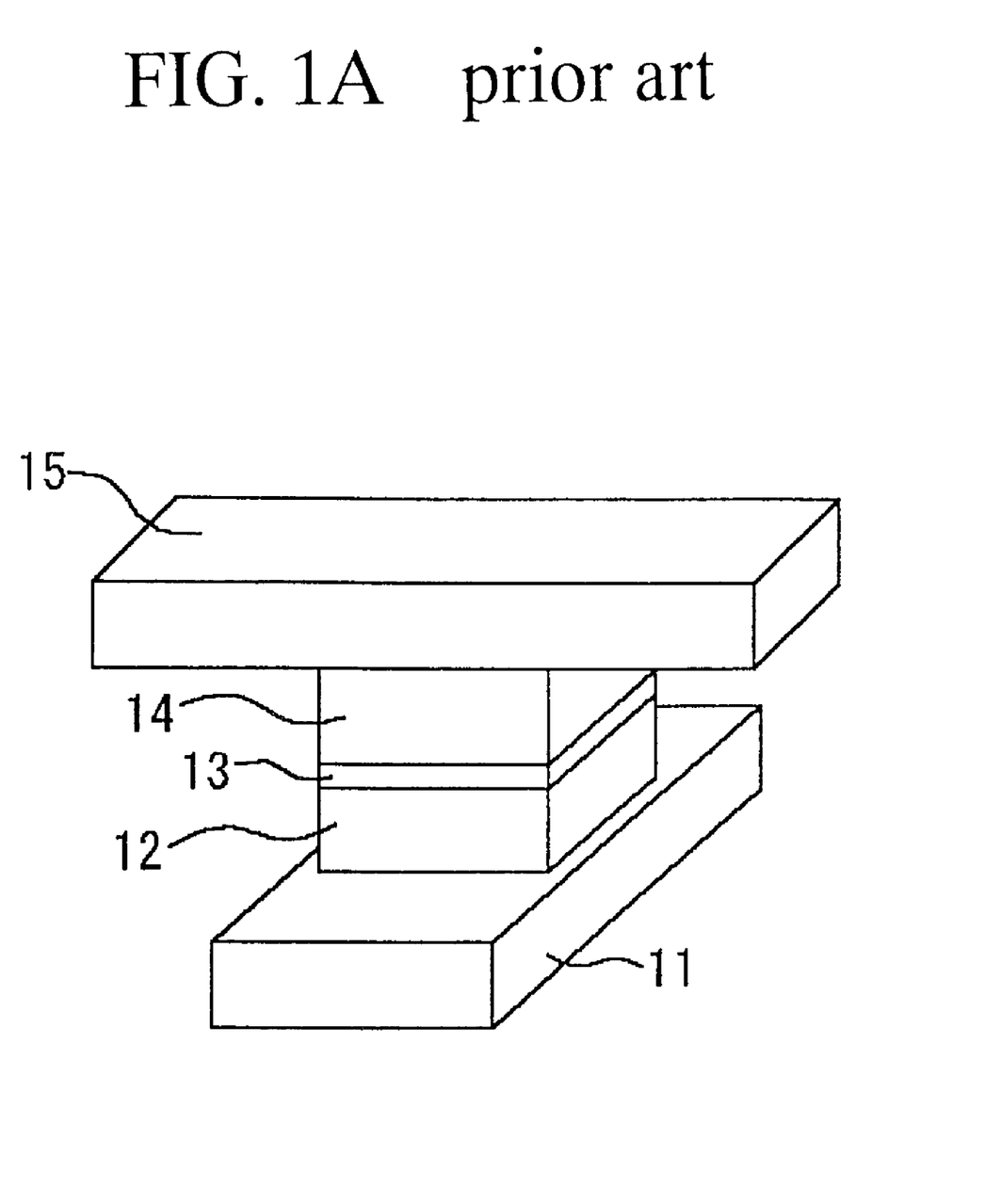
FIG. 1A is a schematic perspective view illustrative of one of conventional magnetoresistance elements serving as magnetic memory cells, of the MRAM device.
Figure 1B:
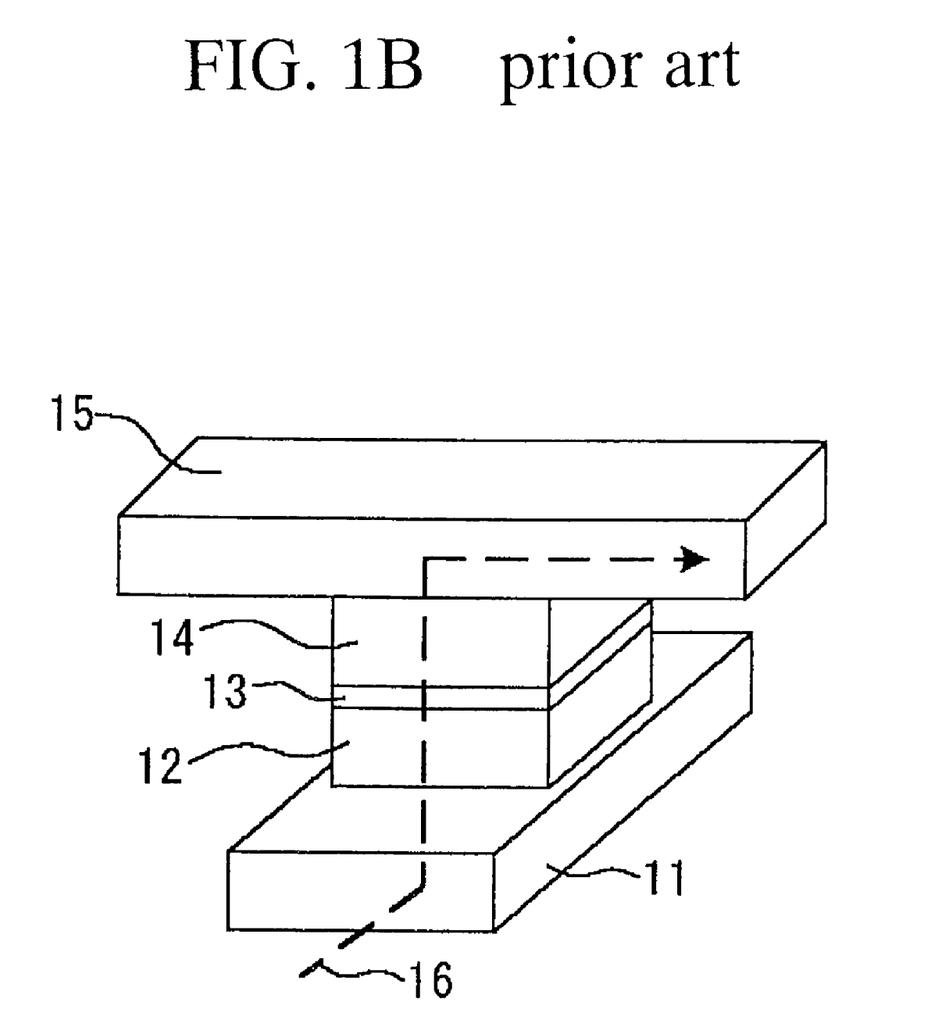
FIG. 1B is a schematic perspective view illustrative of read out operation of the magnetoresistance element of FIG. 1A.
Figure 1C:
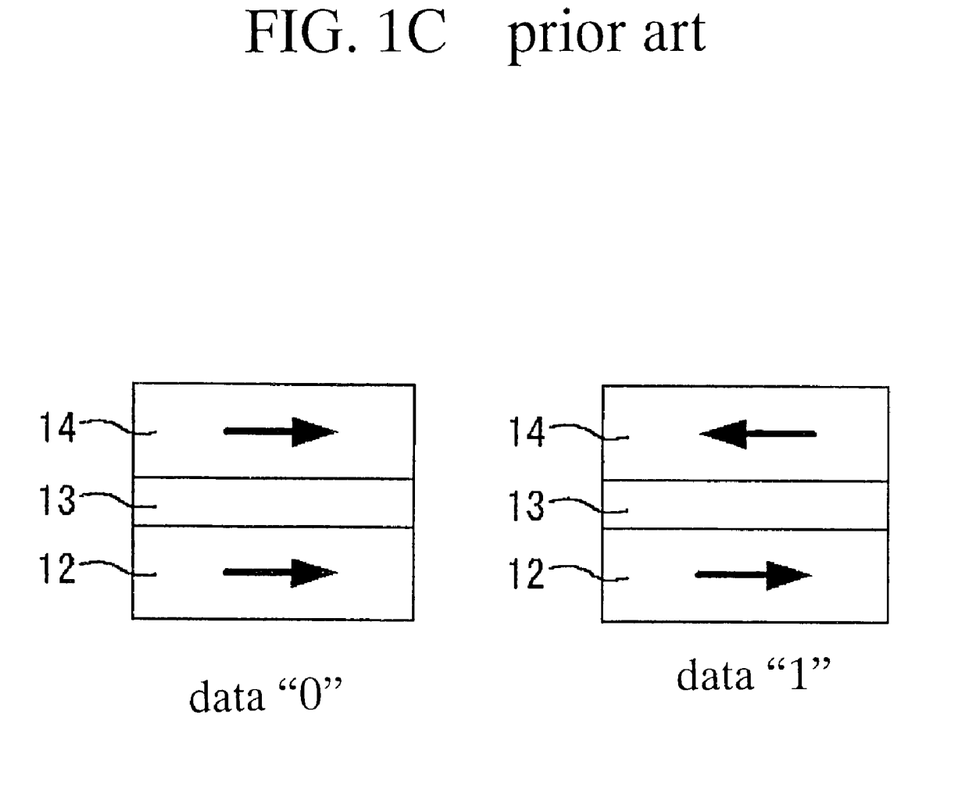
FIG. 1C is a plan view illustrative of respective magnetization states depending on stored data of the magnetoresistance element of FIG. 1A.

A magnetic random access memory device having an array of magnetic memory cells has been known as one of the non-volatile semiconductor memory devices. The magnetic random access memory device has an array of magnetic memory cells, which is which comprises a magnetoresistance element. The magnetic random access memory device will hereinafter referred to as MRAM device. FIG. 1A is a schematic perspective view illustrative of one of conventional magnetoresistance elements serving as magnetic memory cells of the MRAM device. FIG. 1B is a schematic perspective view illustrative of read out operation of the magnetoresistance element of FIG. 1A. FIG. 1C is a plan view illustrative of respective magnetization states depending on stored data of the magnetoresistance element of FIG. 1A.

The single magnetic memory cell comprises a first wiring layer 11, a pinned layer 12, a non-magnetic layer 13, a free layer 14, and a second wiring layer 12. The magnetoresistance element comprises the pinned layer 12, the non-magnetic layer 13, and the free layer 14, wherein the non-magnetic layer 13 is sandwiched between the pinned layer 12 and the free layer 14. The pinned layer 12 is in contact with the first wiring layer 11. The free layer 14 is in contact with the second wiring layer 12. The pinned layer 12 and the free layer 14 are made of ferromagnetic materials. The non-magnetic layer 13 is made of an insulating material. The pinned layer 12 has a thickness of about =B 20 =1 nanometers. The pinned layer 12 has a fixed magnetization direction. The non-magnetic layer 13 has a thickness of about 1.5 nanonmeters. The free layer 14 has a thickness of about 20 nanometers. The free layer 14 has a freely changeable magnetization direction.

The magnetization direction of the free layer 14 indicates stored data. The free layer 14 serves as a data storage layer. The first wiring layer 11 and the second wiring layer 15 extend in directions perpendicular to each other. The magnetoresistanice element is positioned at a crossing point between the first wiring layer 11 and the second wiring layer 15. A current 16 flows from the first wiring layer 11 through the pinned layer 12, the non-magnetic layer 13 and the free layer 14 to the second wiring layer 15. The magnetic memory cell is capable of storing binary digit data "0" and "1". If the magnetization directions of the pinned layer 12 and the free layer 14 are parallel to each other, then this means that the magnetic memory cell stores a first one of binary digits, for example, data "0". If the magnetization directions of the pinned layer 12 and the free layer 14 are anti-parallel to each other, then this means that the magnetic memory cell stores a first one of binary digits, for example, data "1". The magnetization direction of the free layer 14 is changed depending on an externally applied magnetic field.

An electrical resistance of the non-magnetic layer 13 varies by about 10–40% due to the tunneling magnetoresistance effect between in a first state where the magnetization directions of the pinned layer 12 and the free layer 14 are parallel to each other and a second state where the magnetization directions of the pinned layer 12 and the free layer 14 are anti-parallel to each other. A predetermined potential difference or a predetermined voltage is given to the first and second wiring layers 11 and 15 to apply a tunneling current from the pinned layer 12 through the non-magnetic layer 13 to the free layer 14. This tunneling current varies depending on the variable electrical resistance of the non-magnetic layer 13 due to the tunneling magnetoresistance effect. The data can be fetched from the magnetic memory cell by detecting the variation in the tunneling current.

The use of the tunneling magnetoresistance effect for the magnetic memory cell is more advantageous for a highly dense MRAM than a conventional giant magnetoresistance effect because a lead electrode structure of the magnetic memory cell comprising the tunneling magnetoresistance element is more simple than the magnetic memory cell comprising the giant magnetoresistance clement.

Figure 2A:
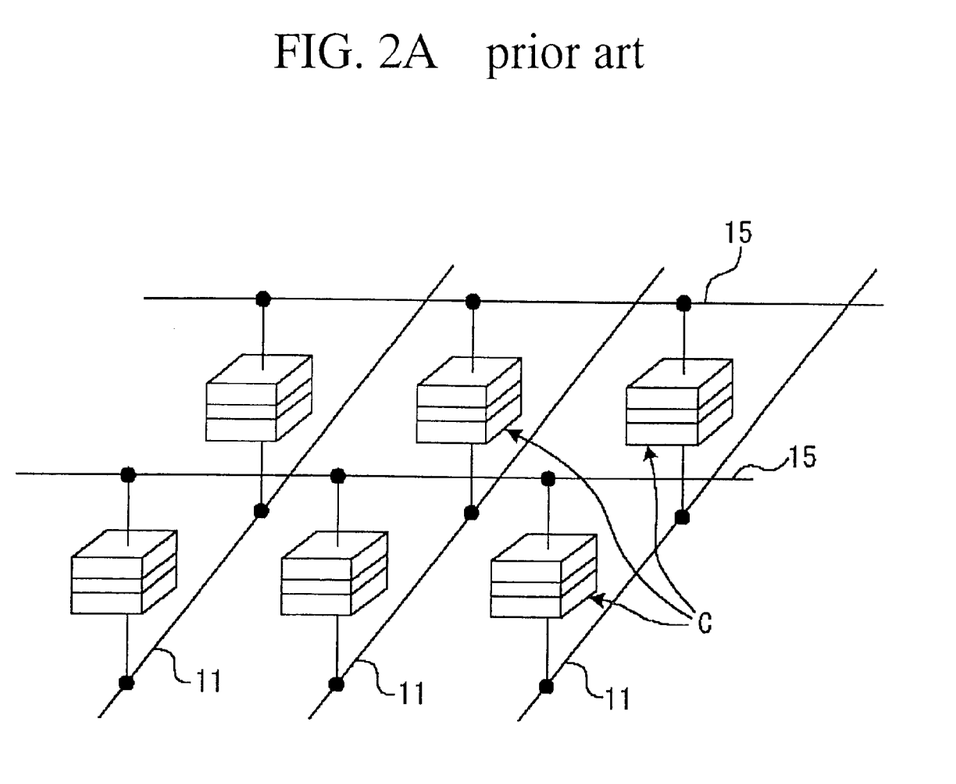
FIG. 2A is a fragmentary schematic perspective view illustrative of an array of magnetic memory cells of the MRAM of FIG. 1A.
Figure 2B:
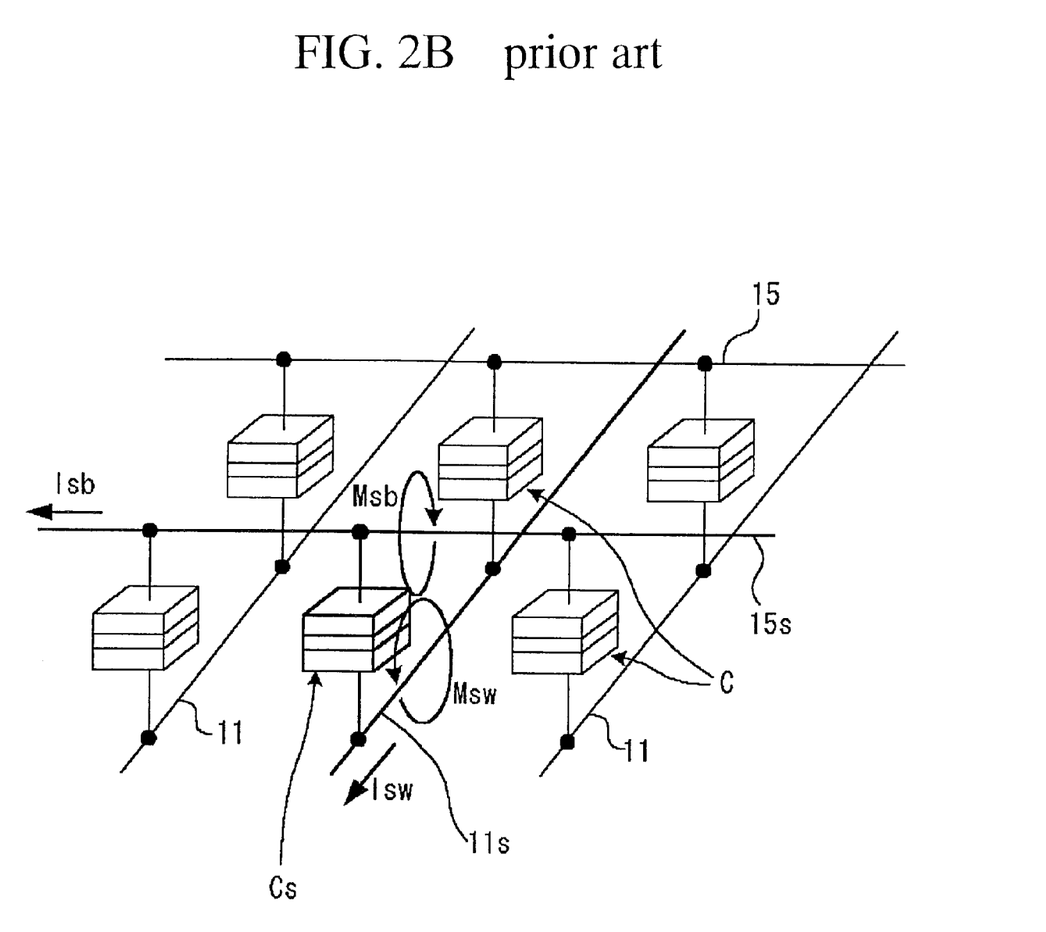
FIG. 2B is a fragmentary schematic perspective view illustrative of the array of the magnetic memory cells in write operation in FIG. 2A.

FIG. 2A is a fragmentary schematic perspective view illustrative of an array of magnetic memory cells of the MRAM of FIG. 1A. FIG. 2B is a fragmentary schematic perspective view illustrative of the array of the magnetic memory cells in write operation in FIG. 2A.

The first wiring layers 11 extend in parallel to each other in a first direction. The second wiring layers 15 extend in parallel to each other in a second direction perpendicular to the first direction. The single first wiring layer 11 and the single second wiring layer 15 has a single crossing point, where a single magnetic memory cell "C" is provided. The plural first wiring layers 11 and the plural second wiring layers 15 have an array of crossing points where plural magnetic memory cells "C" are provided. The first wiring layers 11 serve as word lines. The second wiring layers 15 serve as bit lines. One of the plural magnetic memory cells "C" is selected by selecting one of the word lines and one of the bit lines, for read or write operations to the selected magnetic memory cell "C".

Japanese laid-open patent publication No. 2000-82791 also discloses another MRAM, wherein magnetic tunneling junction devices are used as magnetic memory cells.

The MRAM has the array of the magnetic memory cells, each of which comprises the tunneling magnetoresistance element utilizing the tunneling magnetoresistance effect, wherein the tunneling magnetoresistance element includes an insulating thin film sandwiched between the at least two ferromagnetic thin films. The tunneling magnetoresistance element is switched between a first state that the magnetization directions of the two ferromagnetic thin films are parallel to each other and a second state that the magnetization directions of the two ferromagnetic thin films are anti-parallel to each other. The resistance of the insulating film, that the tunneling current senses, is different in between the first and second states. These two states correspond to binary digits, for example, the first state corresponds to the data "0" and the second state corresponds to the data "1".

The write operation is accomplished as follows. One of the word lines 11 and one of the bit lines 15 are selected. A first write current Isw is applied to the selected word line 11s. A first magnetic field Msw is generated around the relected word line 11s. The first write current Isw has a predetermined current value and a predetermined direction. A second write current Isb is applied to the selected bit line 15s. The second write current Isb has a predetermined current value and a predetermined direction. A second magnetic field Msb is generated around the selected bit line 15s. As a result, a superimposed magnetic field of both the first and second magnetic field Msw and Msb is applied to the crossing point of the selected word line 11s and the selected bit line 15s. The selected magnetic memory cell "Cs" is positioned at the crossing point of the selected word line 11s and the selected bit line 15s, for which reason the selected magnetic memory cell "Cs" is applied with the superimposed magnetic field. The free layer of the selected magnetic memory cell "Cs" is also applied with the superimposed magnetic field, whereby magnetic domains of the free layer become ordered in a first direction, for example, in a direction parallel to the magnetization direction of the pinned layer. As a result, the selected magnetic memory cell "Cs" stores a binary digit data "0".

Any one of the first write current Isw and the second write current Isb changes its current direction to an opposite direction, whereby the direction of the magnetic field is inverted, and the direction of the superimposed magnetic field is changed by 90 degrees. As a result, the magnetic domains of the free layer become ordered in a second direction, for example, in a direction anti-parallel to the magnetization direction of the pinned layer. As a result, the selected magnetic memory cell "Cs" stores another binary digit data "1".

The read operation is accomplished as follows. One of the word lines 11 and one of the bit lines 15 arc selected. A potential difference is given to between the selected word line 11s and the selected bit line 15s for measuring a current value to detect a resistance value of the selected memory cell "Cs" to the tunneling current. Namely, a predetermined potential difference or a predetermined voltage is given to the selected word line 11s and the selected bit line 15s to apply a tunneling current from the pinned layer through the insulating layer to the free layer of the selected memory cell "Cs". This tunneling current varies depending on the variable electrical resistance of the insulating layer due to the tunneling magnetoresistance effect. The binary digit data can be detected from the selected memory cell "Cs" by detecting the variation in the tunneling current.

Figure 3:
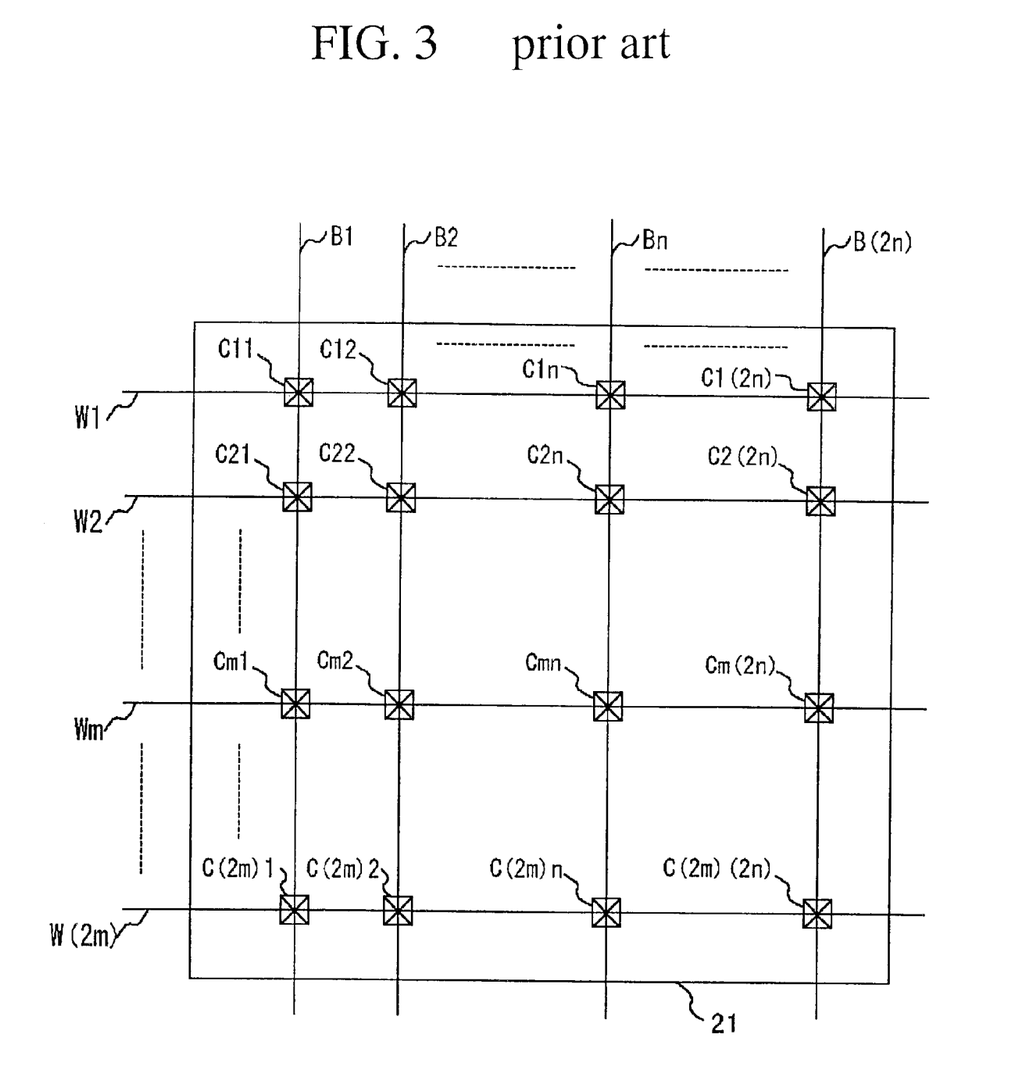
FIG. 3 is a diagram illustrative of a conventional array structure of the magnetic memory cells in the MRAM.

FIG. 3 is a diagram illustrative of a conventional array structure of the magnetic memory cells in the MRAM. An array 21 includes 2m of word lines W1, W2, W3, - - - Wm, Wm+1, - - -, and W2m, and 2n of bit lines B1, B2, B3, - - - Bn, Bn+1, - - -, B2n, as well as 2m×2n of magnetic memory cells C11, C12, - - -, C2m2n which are positioned at crossing points of the word and bit lines. A word line Wi and a bit line Bj are selected to select a magnetic memory cell Cij positioned at the crossing point between the selected word line Wi and the selected bit line Bj for read or write operation as described above.

The variation in tunneling current through the selected magnetic memory cell is faint. As the array size is increased and the number of the memory cells connected to the single word line or the single bit line is increased, a parasitic capacitance between the selected word and bit lines is increased because the insulating non-magnetic layer sandwiched by the ferromagnetic free and pinned layers is extremely thin, for example, about 1.5 nanometers. The increase in the parasitic capacitance causes an increase in response delay time in read operation, whereby an access time becomes long.

In order to realize a high speed access to the magnetic memory cells, it is desirable to limit the number of the magnetic memory cells connected to the single word line or the single bit line. This provides a limitation to the cell array scale.

Even if the increase in the access time to the memory cells is accepted, then further problem is raised with the increase in the resistances of the word and bit lines, so that the resistances of the word and bit lines become so large as not ignorable with reference to the resistance of the insulating non-magnetic layer sandwiched by the ferromagnetic free and pinned layers, thereby making it difficult to detect the inherently faint variation of the tunneling current.

In the above circumstances, the development of a novel non-volatile semiconductor memory device free from the above problems is desirable.

SUMMARY OF THE INVENTION

Accordingly, it is an object of the present invention to provide a novel non-volatile semiconductor memory device free from the above problems.

It is a further object of the present invention to provide a novel non-volatile semiconductor memory device having a large scale array of magnetic memory cells with reduced parasitic capacitances of word and bit lines.

It is a still further object of the present invention to provide a novel non-volatile semiconductor memory device allowing high speed access to the magnetic memory cells.

It is yet a further object of the present invention to provide a novel MRAM free from the above problems.

It is yet a further object of the present invention to provide a novel MRAM having a large scale array of magnetic memory cells with reduced parasitic capacitances of word and bit lines.

It is yet a further object of the present invention to provide a novel MRAM allowing high speed access to the magnetic memory cells.

It is yet a further object of the present invention to provide a novel magnetic memory cell array free from the above problems.

It is yet a further object of the present invention to provide a novel magnetic memory cell array having a large scale with reduced parasitic capacitances of word and bit lines.

It is yet a further object of the present invention to provide a novel magnetic memory cell array allowing high speed access to the magnetic memory cells.

The present invention provides a memory cell array structure comprising: a plurality of cell array blocks aligned in matrix in both the row and column directions, and each of the cell array blocks including a plurality of magnetic memory cells; a plurality of main word lines extending in a row direction, and each of the main word lines being connected through sub-word switching devices to the same number of sub-word lines as a first number of the cell array blocks aligned in the row direction, and each of the sub-word lines being connected to at least one of the magnetic memory cells; and a plurality of main bit lines extending in a column direction, and each of the main bit lines being connected through sub-bit switching devices to the same number of sub-bit lines as a second number of the cell array blocks aligned in the column direction, and each of the sub-bit lines being connected to at least one of the magnetic memory cells.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

A first aspect of the present invention is a memory cell array structure comprising: a plurality of cell array blocks aligned in matrix in both the row and column directions, and each of the cell array blocks including a plurality of magnetic memory cells; a plurality of main word lines extending in a row direction, and each of the main word lines being connected through sub-word switching devices to the same number of sub-word lines as a first number of the cell array blocks aligned in the row direction, and each of the sub-word lines being connected to at least one of the magnetic memory cells; and a plurality of main bit lines extending in a column direction, and each of the main bit lines being connected through sub-bit switching devices to the same number of sub-bit lines as a second number of the cell array blocks aligned in the column direction, and each of the sub-bit lines being connected to at least one of the magnetic memory cells.

It is preferable to further comprise the same number of word selecting lines as the first number of the cell array blocks aligned in the row direction, and the same number of bit selecting lines as the second number of the cell array blocks aligned in the column direction, and the word selecting lines are connected to control electrodes of the sub-word switching devices, and the bit selecting lines are connected to control electrodes of the sub-bit switching devices.

It is also preferable that the first number and the second number are two or more. The first number and the second number may be the same as each other.

It is also preferable that each of the cell array blocks includes a matrix array of the magnetic memory cells.

It is also preferable that the main word lines are lower in a resistance value per a unit length than the sub-word lines. The main word lines may be larger in sectioned area than the sub-word lines.

It is also preferable that the main word lines are lower in resistivity than the sub-word lines.

It is also preferable that the main bit lines are lower in a resistance value per a unit length than the sub-bit lines. The main bit lines may be larger in sectioned area than the sub-bit lines. Alternatively, the main bit lines may be lower in resistivity than the sub-bit lines.

It is also preferable that each of the magnetic memory cells comprises a tunneling magnetoresistance element utilizing a tunneling magnetoresistance effect.

As described above, each of the main word lines may become electrically coupled with a less number than the total number of the memory cells aligned in the row direction, and each of the main bit lines may become electrically coupled with a less number than the total number of the memory cells aligned in the column direction. The above cell array block structure reduces the number of the memory cells electrically coupled with each of the main word lines and each of the main bit lines, even the size of the cell array remains large. The reduction in the number of the memory cells electrically coupled with each of the main word lines and each of the main bit lines reduces the effective parasitic capacitances of each of the main word lines and each of the main bit lines. The reductions in the effective parasitic capacitances of each of the main word lines and each of the main bit lines shorten the access time to the magnetic memory cells, thereby allowing high speed accesses to the memory cells.

Further, the above cell array block structure also allows the increase in the cell array seize and the degree of integration of the cell arrays with keeping the high speed accesses to the memory cells.

Further more, it is preferable that each of the main word lines is smaller in a resistance value per a unit length than each of the sub-word lines, and also preferable that each of the main bit lines is smaller in a resistance value per a unit length than each of the sub-bit lines, so as to reduce the resistance values of each of the main word lines and each of the main bit lines. These reductions in the resistance values of each of the main word lines and each of the main bit lines may prevent any reduction in the read current These reductions also may allow the increases in the lengths of each of the main word lines and each of the main bit lines, thereby allowing the increase in the cell array size and the degree of integration of the cell arrays with keeping the high speed accesses to the memory cells. These reductions also may shorten the access time to the magnetic memory cells, thereby allowing high speed accesses to the memory cells.

A second aspect of the present invention is a semiconductor memory device comprising: a plurality of cell array blocks aligned in matrix in both the row and column directions, and each of the cell array blocks including a plurality of magnetic memory cells; a plurality of main word lines extending in a row direction, and each of the main word lines being connected through sub-word switching devices to the same number of sub-word lines as a first number of the cell array blocks aligned in the row direction, and each of the sub-word lines being connected to at least one of the magnetic memory cells; a plurality of main bit lines extending in a column direction, and each of the main bit lines being connected through sub-bit switching devices to the same number of sub-bit lines as a second number of the cell array blocks aligned in the column direction, and each of the sub-bit lines being connected to at least one of the magnetic memory cells; the same number of word selecting lines as the first number of the cell array blocks aligned in the row direction, and the word selecting lines being connected to control electrodes of the sub-word switching devices; the same number of bit selecting lines as the second number of the cell array blocks aligned in the column direction, and the bit selecting lines being connected to control electrodes of the sub-bit switching devices; a single memory cell block selecting circuit being connected to the word selecting lines and the bit selecting lines for selecting one of the word selecting lines and one of the bit selecting lines so as to select one of the cell array blocks; a single row selecting circuit being connected to all of the main word lines for selecting one of the main word lines; and a single column selecting circuit being connected to all of the main bit lines for selecting one of the main bit lines.

It is preferable that the first number and the second number are two or more. The first number and the second number may be the same as each other.

It is preferable that each of the cell array blocks includes a matrix array of the magnetic memory cells.

It is preferable that the main word lines are lower in a resistance value per a unit length than the sub-word lines. The main word lines may be larger in sectioned area than the sub-word lines. Alternatively, the main word lines may be lower in resistivity than the sub-word lines.

It is preferable that the main bit lines are lower in a resistance value per a unit length than the sub-bit lines. The main bit lines may be larger in sectioned area than the sub-bit lines. Alternatively, the main bit lines may be lower in resistivity than the sub-bit lines.

It is preferable that each of the magnetic memory cells comprises a tunneling magnetoresistance element utilizing a tunneling magnetoresistance effect.

It is preferable that the semiconductor memory device comprises a magnetic random access memory device.

This second aspect of the present invention has further same characteristics as follows. The above plural cell array blocks commonly need only the single memory cell block selecting circuit, the single row selecting circuit, the single column selecting circuit, the single row write/read circuit and the column write/read circuit. It is not necessary to provide plural memory cell block selecting circuits, plural row selecting circuits, plural column selecting circuits, plural row write/read circuits and plural column write/read circuits. This allows the reductions in size and occupied area of the non-volatile semiconductor memory device thereby reducing a chip area.

First Embodiment

Figure 4:
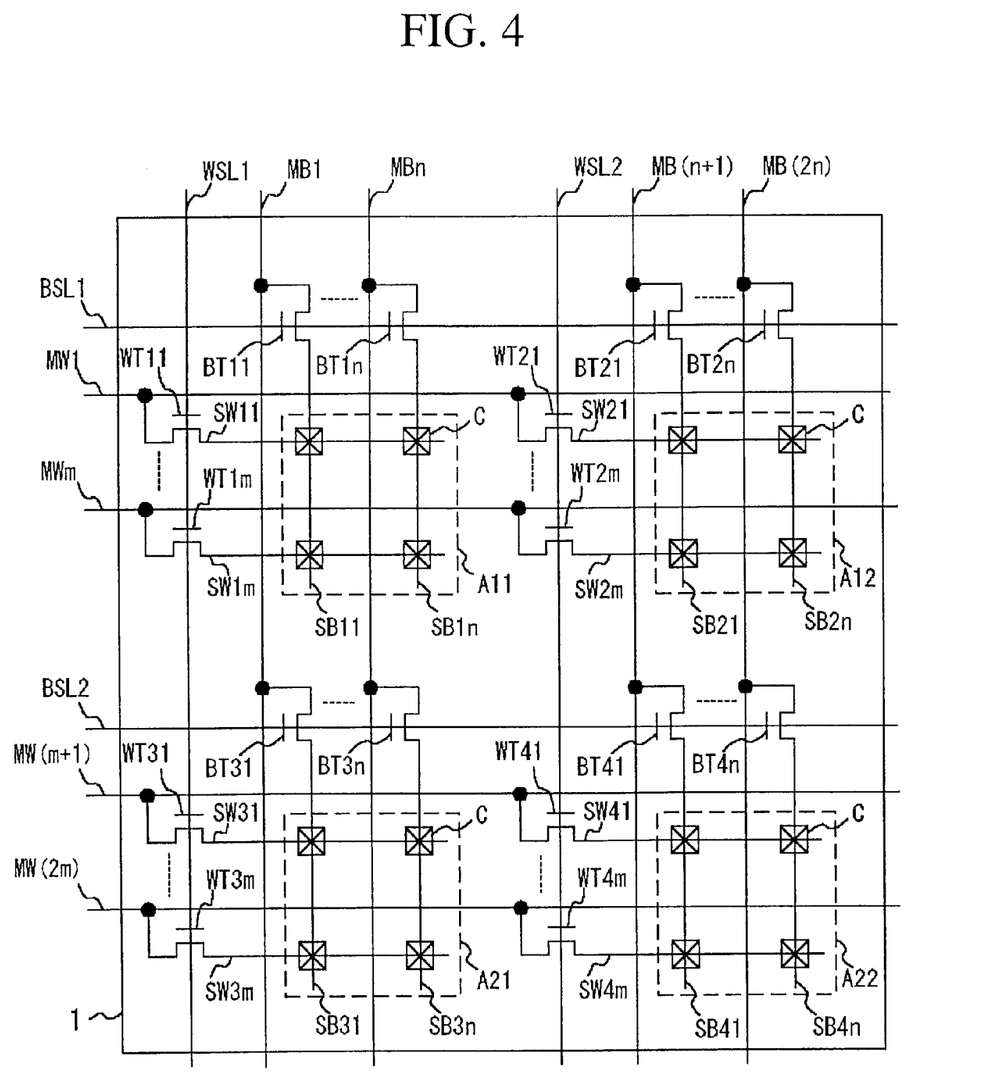
FIG. 4 is a diagram illustrative of a novel array structure of magnetic memory cells of MRAM in a first embodiment in accordance with the present invention.

A first embodiment according to the present invention will be described in detail with reference to the drawings. FIG. 4 is a diagram illustrative of a novel array structure of magnetic memory cells of MRAM in a first embodiment in accordance with the present invention.

An array 1 includes 2m of main word lines MW1, MW2, - - -, MWm, MW(m+1), - - - MW2m, and 2n of main bit liens MB1, MB2, - - -, MBn, MB(n+1), - - - MB2n, first and second word selecting lines WSL1, WSL2 and first and second bit selecting lines BSL1 and BSL2. The array 1 includes first to fourth memory cell blocks A11, A12, A21 and A22 which are aligned in 2×2 matrix, The first memory cell block A11 has the first word selecting line WS1 and the first bit selecting line BS1. The second memory cell block A12 has the first word selecting line WS1 and the second bit selecting line BS2. The third memory cell block A21 has the second word selecting line WS2 and the first bit selecting line BS1. The fourth memory cell block A22 has the second word selecting line WS2 and the second bit selecting line BS2.

The first memory cell block A11 includes "m" of sub-word lines SW11, SW12, - - - SW1m, and "n" of sub-bit lines SB11, SB12, - - - SB1n as well as magnetic memory cells "C" at crossing points between the sub-word lines and the sub-bit lines, so that the magnetic memory cells "C" are aligned in "m"×"n" matrix. The sub-word lines SW11, SW12, - - - SW1m are connected through word selecting transistors WT11, WT12, - - - WT1m to the main word lines MW1, MW2, - - -, MWm respectively, The sub-bit lines SB11, SB12, - - - SB1n are connected through bit selecting transistors BT11, BT12, - - - BT1n to the main bit lines MB1, MB2, - - - MBn respectively. Gates of the word selecting transistors WT11, WT12, - - - WT1m are commonly connected to the first word selecting line WSL1. Gates of the bit selecting transistors BT11, BT12, - - - BT1n are commonly connected to the first bit selecting line BSL1.

The second memory cell block A12 includes "m" of sub-word lines SW21, SW22, - - - SW2m, and "n" of sub-bit lines SB21, SB22, - - - SB2n as well as magnetic memory cells "C" at crossing points between the sub-word lines and the sub-bit lines, so that the magnetic memory cells "C" are aligned in "m"×"n" matrix. The sub-word lines SW21, SW22, - - - SW2m are connected through word selecting transistors WT21, WT22, - - - WT2m to the main word lines MW1, MW2, - - -, MWm respectively. The sub-bit lines SB21, SB22, - - - SB2n are connected through bit selecting transistors BT21, BT22, - - - BT2n to the main bit lines MBn+1, MBn+2, - - - MB2n respectively. Gates of the word selecting transistors WT21, WT22, - - - WT2m are commonly connected to the second word selecting line WSL2. Gates of the bit selecting transistors BT21, BT22, - - - BT2n are commonly connected to the first bit selecting, line BSL1.

The third memory cell block A21 includes "m" of sub-word lines SW31, SW32, - - - SW3m, and "n" of sub-bit lines SB31, SB32, - - - SB3n as well as magnetic memory cells "C" at crossing points between the sub-word lines and the sub-bit lines, so that the magnetic memory cells "C" are aligned in "m"×"n" matrix. The sub-word lines SW31, SW32, - - - SW3m are connected through word selecting transistors WT31, WT32, - - - WT3m to the main word lines MWm+1, MWm+2, - - - MW2m respectively. The sub-bit lines SB31, SB32, - - - SB3n are connected through bit selecting transistors BT31, BT32, - - - BT3n to the main bit lines MB1, MB2, - - - MBn respectively. Gates of the word selecting transistors WT31, WT32, - - - WT3m are commonly connected to the first word selecting line WSL1. Gates of the bit selecting transistors BT31, BT32, - - - BT31n arc commonly connected to the second bit selecting line BSL2.

The fourth memory cell block A22 includes "m" of sub-word lines SW41, SW42, - - - SW4m, and "n" of sub-bit lines SB41, SB42, - - - SB4n as well as magnetic memory cells "C" at crossing points between tile sub-word lines and the sub-bit lines, so that the magnetic memory cells "C" are aligned in "m"×"n" matrix. The sub-word lines SW41, SW42, - - - SW4m are connected through word selecting transistors WT41, WT42, - - - WT4m to the main word lines MWm+1, MWm+2, - - -, MW2m respectively. The sub-bit lines SB41, SB42, - - - SB4n are connected through bit selecting transistors BT41, BT42, - - - BT4n to the main bit lines MBn+1, MBn+2, - - - MB2n respectively. Gates of the word selecting transistors WT41, WT42, - - - WT4m arc commonly connected to the second word selecting line WSL2. Gates of the bit selecting transistors BT41, BT42, - - - BT4n are commonly connected to the second bit selecting line BSL2.

Each of the main word liens is connected to the two sub-word lines through the two word selecting transistors, Each of the main bit lines is also connected to the two sub-bit lines through the tow bit selecting transistors. Each of the suh-word lines is connected to "n" of the magnetic memory cells. Each of the sub-bit liens is connected to "m" of the magnetic memory cells.

Figure 5:
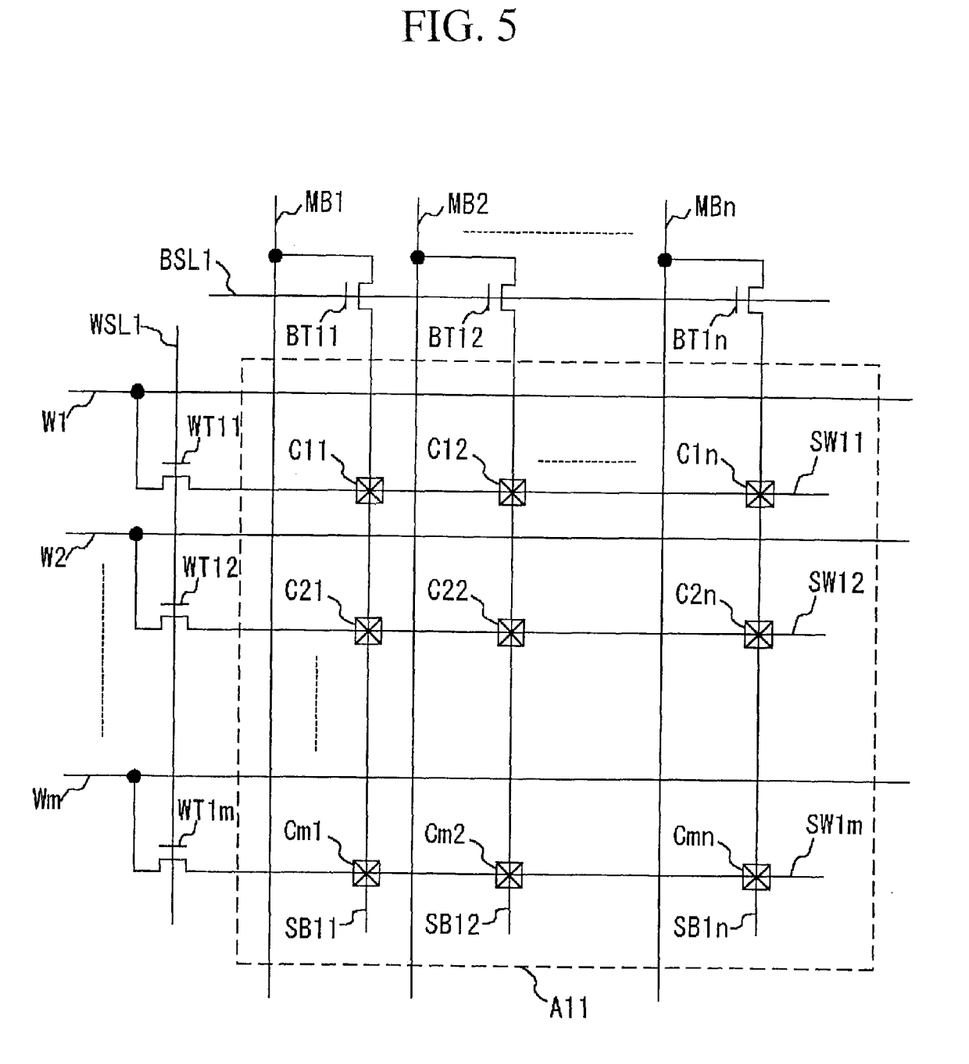
FIG. 5 is a fragmentary diagram illustrative of the first memory cell array block of FIG. 4.

FIG. 5 is a fragmentary diagram illustrative of the first memory cell array block of FIG. 4. The first memory cell block A11 has the main word lines MW1, MW2, - - - MWm and the main bit lines MB1, MB2, - - - MBn. The first memory cell block A11 includes the sub-word lines SW11, SW12, - - - SW1m which are connected through the word selecting transistors WT11, WT12, - - - MT1m to the main word lines MW1, MW2, - - - MWm respectively. The first memory cell block A11 also includes the sub-bit lines SB11, SB12, - - - SB1n which are connected through the bit selecting transistors BT11, BT12, - - - BT1m to the main bit lines MB1, MB12, - - - MBm respectively. The first memory cell block A11 also includes "m"×"n" matrix array of the magnetic memory cells C11, C12, - - - , C1n, C21, C22, - - - C2n, - - - , Cm1, Cm2 - - - Cmn which are positioned at crossing points of the sub-word lines SW11, SW12, - - - SW1m and the sub-bit lines SB11, SB12, - - - SB1n. Gates of the word selecting transistors WT11, WT12, - - - WT1m are commonly connected to the first word selecting line WSL1. Gates of the bit selecting transistors BT11, BT12, - - - BT1n are commonly connected to the first bit selecting line BSL1.

Each of the magnetic memory cells may comprise a tunneling magnetoresistance element utilizing a tunneling magnetoresistance effect. Each of the magnetic memory cells is connected between single-paired sub-word line and sub-bit line.

The each structure of the second, third and fourth cell array blocks is the same as described above.

As described above, each of the main word liens is connected to the two sub-word lines through the two word selecting transistors. Each of the main hit lines is also connected to the two sub-bit lines through the tow bit selecting transistors. Each of the sub-word lines is connected to "n" of the magnetic memory cells. Each of the sub-bit liens is connected to "m" of the magnetic memory cells.

Namely, each of the main word lines becomes electrically coupled to "n" of the memory cells if one of the first and second word selecting lines WSL1 and WSL2 is sclected. Each of the main bit lines becomes electrically coupled to "m" of the memory cells if one of the first and second bit selecting lines BSL1 and BSL2 is selected.

For selecting the first memory cell array block A11, the first word selecting line WSL1 and the first bit selecting line BSL1 are selected to place the word selecting transistors WT11, WT12, - - - , WT1m in ON-state, and also place the bit selecting transistors BT11, BT12, - - - , BT1n in ON-state. As a result, each of the main word lines MW1, MW2, - - - , MWm becomes electrically coupled with "n" of the magnetic memory cells in the first array block A11, and becomes disconnected from "n" of the magnetic memory cells in the second array block A12. Each of the main bit lines MB1, MB2, - - - , MBn becomes electrically coupled with "m" of the magnetic memory cells in the first array block A11, and becomes disconnected from "m" of the magnetic memory cells in the third array block A21.

For selecting the second memory cell array block A12, the first word selecting line WSL1 and the second bit selecting line BSL2 are selected to place the word selecting transistors WT21, WT2, - - - , WT2m in ON-state, and also place the bit selecting transistors BT21, B22, - - - , BT2n in ON-state. As a result, each of the main word lines MW1, MW2, - - - , MWm becomes electrically coupled with "n" of the magnetic memory cells in the second array block A12, and becomes disconnected from "n" of the magnetic memory cells in the first array block A11. Each of the main bit lines MBn+1, MBn+2, - - - , MB2n becomes electrically coupled with "m" of the magnetic memory cells in the second array block A12, and becomes disconnected from "m" of the magnetic memory cells in the fourth array block A22.

For selecting the third memory cell array block A21, the first word selecting line WSL1 and the second bit selecting line BSL2 arc selected to place the word selecting transistors W131, W132, - - - , WT3m in ON-state, and also place the bit selecting transistors BT31, BT32, - - - - , BT3n in ON-state. As a result, each of the main word lines MWm+1, MWm+2, - - - , MW2m becomes electrically coupled with "n" of the magnetic memory cells in the third array block A21, and becomes disconnected from "n" of the magnetic memory cells in the fourth array block A22. Each of the main bit lines MB1, MB2, - - - , MBn becomes electrically coupled with "m" of the magnetic memory cells in the third array block A21, and becomes disconnected from "m" of the magnetic memory cells in the first array block A11.

For selecting the fourth memory cell array block A22, the second word selecting line WSL2 and the second bit selecting line BSL2 are selected to place the word selecting transistors WT41, WT42, - - - , WT4m in ON-state, and also place the bit selecting transistors BT41, BT42, - - - , BT4n in ON-state. As a result, each of the main word lines MWm+1, MWm+2, - - - - , MW2m becomes electrically coupled with "n" of the magnetic memory cells in the fourth array block A22, and becomes disconnected from "n" of the magnetic memory cells in the third array block A21. Each of the main bit lines MBn+1, MBn+2, - - - , MB2n becomes electrically coupled with "m" of the magnetic memory cells in the fourth array block A22, and becomes disconnected from "m" of the magnetic memory cells in the second array block A12.

As described above, each of the main word lines may become electrically coupled with a half number of the total number of the memory cells aligned in the row direction, and each of the main bit lines may become electrically coupled with a half number of the total number of the memory cells aligned in the column direction. The above cell array block structure reduces the number of the memory cells electrically coupled with each of the main word lines and each of the main bit lines, even the size of the cell array remains large. The reduction in the number of the memory cells electrically coupled with each of the main word lines and each of the main bit lines reduces the effective parasitic capacitances of each of the main word lines and each of the main bit lines. The reductions in the effective parasitic capacitances of each of the main word fines and each of the main bit lines shorten the access time to the magnetic memory cells. thereby allowing high speed accesses to the memory cells.

Further, the above cell array block structure also allows the increase in the cell array seize and the degree of integration of the cell arrays with keeping the high speed accesses to the memory cells.

Further more, it is preferable that each of the main word lines is smaller in a resistance value per a unit length than each of the sub-word lines, and also preferable that each of the main bit lines is smaller in a resistance value per a unit length than each of the sub-bit lines, so as to reduce the resistance values of each of the main word lines and each of the main bit lines. These reductions in the resistance values of each of the main word lines and each of the main bit lines may prevent any reduction in the read current. These reductions also may allow the increases in the lengths of each of the main word lines and each of the main bit lines, thereby allowing the increase in the cell array size and the degree of integration of the cell arrays with keeping the high speed accesses to the memory cells. These reductions also may shorten the access time to the magnetic memory cells, thereby allowing high speed accesses to the memory cells.

In order to realize the above secondary preferable feature, it is effective that each of the main word lines is made of a conductive material smaller in resistivity than each of the sub-word lines, and also that each of the main bit lines is made of a conductive material smaller in resistivity than each of the sub-bit lines. In this case, Al is available for the sub-word lines and the sub-bit lines because Al has a high formability, and Cu is available for the main word lines and the main bit lines because Cu is smaller in resistivity than Al.

Alternatively, in order to realize the above secondary preferable feature, it is effective that each of the main word lines is larger in sectioned area or wider and thicker than each of the sub-word lines, and also that each of the main bit lines is larger in sectioned area or wider and thicker than each of the sub-bit lines.

In the above preferred embodiment, the memory cell array includes four blocks and two word selecting lines and two bit selecting lines for selecting one of the four blocks. The number of the cell array blocks may be changed optionally, provided that at least two cell array blocks are necessary for obtaining the above effects and advantages. The number of the word selecting lines is the same as the number of the cell array blocks in the row direction. The number of the bit selecting lines is the same as the number of the cell array blocks in the column direction. The increase in the number of the cell array blocks provides greater effects and advantages described above.

Figure 6:
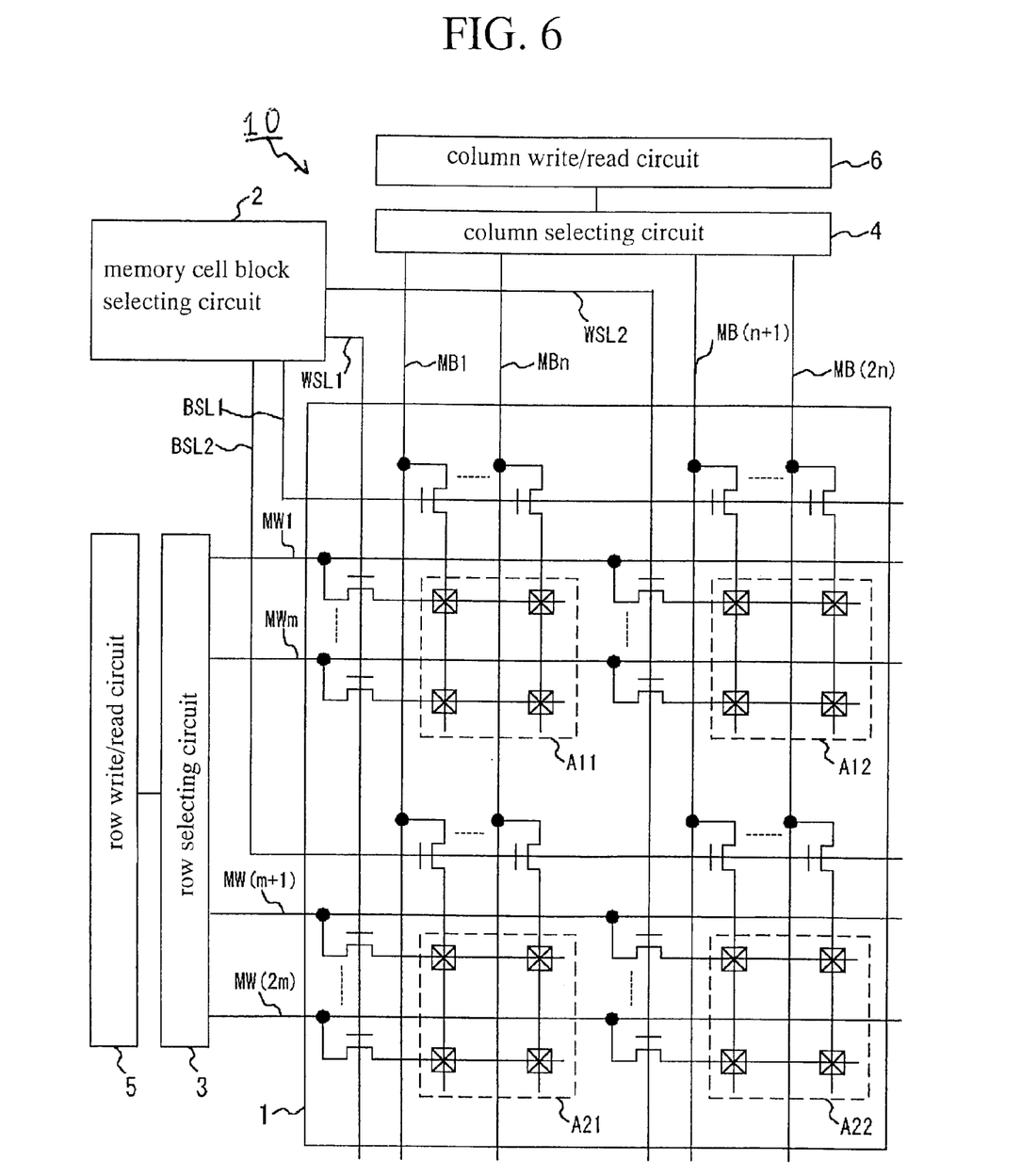
FIG. 6 is a diagram illustrative of a non-volatile semiconductor memory device having the novel memory cell array structure of FIG. 4.

The above described novel memory cell array may be applied to the non-volatile semiconductor memory device. FIG. 6 is a diagram illustrative of a non-volatile semiconductor memory device having the novel memory cell array structure of FIG. 4.

A non-volatile semiconductor memory device 10 includes the memory cell array 1 having the four cell array blocks A11, A12, A21 and A22 as described above with reference to FIG. 4. The structure of the memory cell array 1 is the same as described above, for which reason the description of the memory cell array 1 is omitted.

The non-volatile semiconductor memory device 10 farther includes a single memory cell block selecting circuit 2, a single row selecting circuit 3, a column selecting circuit 4, a row write/read circuit 5 and a column write/read circuit 6. The single memory cell block selecting circuit 2 is connected to the first and second word selecting lines WSL1. and WSL2 and also the first and second bit selecting lines BSL1 and BSL2 for selecting one of the first and second word selecting lines WSL1 and WSL2 and also selecting one of the first and second bit selecting lines BSL1 and BSL2. The row selecting circuit 3 is connected to all of the main word lines MW1, MW2, - - - MWm, MWm+1, - - - MW2m for selecting one of the main word lines MW1, MW2, - - - MWm, MWm+1, - - - MW2m. The column selecting circuit 4 is connected to all of the main bit lines MB1, MB2, - - - MBn, MBn+1, - - - MB2n for selecting one of the main bit lines MB1, MB2 - - - MBn, MBn+1, - - - MB2n.

The row write/read circuit 5 is connected to the row selecting circuit 3 for supplying a write current through the row selecting circuit 3 to the selected one of the main word lines in write operation and also supplying a read voltage through the row selecting circuit 3 to the selected one of the main word lines in read operation. The memory cell block selecting circuit 2 selects one of the first and second word selecting lines WSL1 and WSL2 to place the word selecting transistors having gates connected to the selected word selecting line into ON-state, whereby the write current or the read voltage is supplied to only one sub-word line connected to the selected main word lint through the ON-state word selecting transistor.

The column write/read circuit 6 is connected to the column selecting circuit 4 for supplying a write current through the column selecting circuit 4 to the selected one of the main bit lines in write operation and also supplying a read voltage through the column selecting circuit 3 to the selected one of the main bit lines in read operation. The memory cell block selecting circuit 2 selects one of the first and second bit selecting lines BSL1 and BSL2 to place the bit selecting transistors having gates connected to the selected bit selecting line into ON-state, whereby the write current or the read voltage is supplied to only one sub-bit line connected to the selected main bit line through the ON-state bit selecting transistor.

Accordingly, in the read operation, one sub-word line and one sub-bit line are selected and supplied with the read voltages, so that the magnetic memory cell connected between the selected one sub-word line and the selected one sub-bit line is supplied with the read voltage application for causing a tunneling current through the selected one magnetic memory cell. The tunneling current is then flown from the selected main word line and the selected one main bit line. Even illustration is omitted, then at least one of the row and column write/read circuits 5 and 6 has a sense amplifier for sensing the tunneling current to detect the stored binary digit data of the selected one magnetic memory cell.

In the write operation, one sub-word line and one sub-bit line are selected and supplied with the read voltages, so that the magnetic memory cell connected between the selected one sub-word line and the selected one sub-bit line is supplied with the write current application for generating a magnetic field applied to the selected one magnetic memory cell for storing one of the binary digit data therein.

The above plural cell array blocks commonly need only the single memory cell block selecting circuit 2, the single row selecting circuit 3, the single column selecting circuit 4, the single row write/read circuit 5 and the column write/read circuit 6. It is not necessary to provide plural memory cell block selecting circuits, plural row selecting circuits, plural column selecting circuits, plural row write/read circuits and plural column write/read circuits. This allows the reductions in size and occupied area of the non-volatile semiconductor memory device thereby reducing a chip area.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A memory cell array structure comprising:
    a plurality of cell array blocks aligned in matrix in both row and column directions, and each of said cell array blocks including a plurality of magnetic memory cells;
    a plurality of main word lines extending in a row direction, and each of said main word lines being connected through sub-word switching devices to a same number of sub-word lines as a first number of said cell array blocks aligned in said row direction, and each of said sub-word lines being connected to at least one of said magnetic memory cells; and a plurality of main bit lines extending in a column direction, and each of said main bit lines being connected through sub-bit switching devices to a same number of sub-bit lines as a second number of said cell array blocks aligned in said column direction, and each of said sub-bit lines being connected to at least one of said magnetic memory cells.

2. The memory cell array structure as claimed in claim 1, further comprising the same number of word selecting lines as said first number of said cell array blocks aligned in said row direction, and the same number of bit selecting lines as said second number of said cell array blocks aligned in said column direction, and said word selecting lines are connected to control electrodes of said sub-word switching devices, and said bit selecting lines are connected to control electrodes of said sub-bit switching devices.

3. The memory cell array structure as claimed in claim 1, wherein said first number and said second number are two or more.

4. The memory cell array structure as claimed in claim 3, wherein said first number and said second number are the same as each other.

5. The memory cell array structure as claimed in claim 1, wherein each of said cell array blocks includes a matrix array of said magnetic memory cells.

6. The memory cell array structure as claimed in claim 1, wherein said main word lines are lower in a resistance value per a unit length than said sub-word lines.

7. The memory cell array structure as claimed in claim 6, wherein said main word lines are larger in sectioned area than said sub-word lines.

8. The memory coil array structure as claimed in claim 6, wherein said main word lines are lower in resistivity than said sub-word lines.

9. The memory cell array structure as claimed in claim 1, wherein said main bit lines are lower in a resistance value per a unit length than said sub-bit lines.

10. The memory cell array structure as claimed in claim 9, wherein said main bit lines are larger in sectioned area than said sub-bit lines.

11. The memory cell array structure as claimed in claim 9, wherein said main bit lines are lower in resistivity than said sub-bit lines.

12. The memory cell array structure as claimed in claim 1, wherein each of said magnetic memory cells comprises a tunneling magnetoresistance element utilizing a tunneling magnetoresistance effect.

13. A semiconductor memory device comprising:

a plurality of cell array blocks aligned in matrix in both row and column directions, and each of said cell array blocks including a plurality of magnetic memory cells;

a plurality of main word lines extending in a row direction, and each of said main word lines being connected through sub-word switching devices to the same number of sub-word lines as a first number of said cell array blocks aligned in said row direction, and each of said sub-word lines being connected to at least one of said magnetic memory cells;

a plurality of main bit lines extending in a column direction, and each of said main bit lines being connected through sub-bit switching devices to the same number of sub-bit lines as a second number of said cell array blocks aligned in said column direction, and each of said sub-bit lines being connected to at least one of said magnetic memory cells;

a same number of word selecting lines as said first number of said cell array blocks aligned in said row direction, and said word selecting lines being connected to control electrodes of said sub-word switching devices;

and a same number of bit selecting lines as said second number of said cell array blocks aligned in said column direction, and said bit selecting lines being connected to control electrodes of said sub-bit switching devices;

a single memory cell block selecting circuit being connected to said word selecting lines and said bit selecting lines for selecting one of said word selecting lines and one of said bit selecting lines so as to select one of said cell array blocks;

a single row selecting circuit being connected to all of said main word lines for selecting one of said main word lines; and a single column selecting circuit being connected to all of said main bit lines for selecting one of said main bit lines.

14. The semiconductor memory device as claimed in claim 13, wherein said first number and said second number are two or more.

15. The semiconductor memory device as claimed in claim 14, wherein said first number and said second number are the same as each other.

16. The semiconductor memory device as claimed in claim 13, wherein each of said cell array blocks includes a matrix array of said magnetic memory cells.

17. The semiconductor memory device as claimed in claim 13, wherein said main word lines are lower in a resistance value per a unit length than said sub-word lines.

18. The semiconductor memory device as claimed in claim 17, wherein said main word lines are larger in sectioned area than said sub-word lines.

19. The semiconductor memory device as claimed in claim 17, wherein said main word lines are lower in resistivity than said sub-word lines.

20. The semiconductor memory device as claimed in claim 13, wherein said main bit lines are lower in a resistance value per a unit length than said sub-bit lines.

21. The semiconductor memory device as claimed in claim 20, wherein said main bit lines are larger in sectioned area than said sub-bit lines.

22. The semiconductor memory device as claimed in claim 20, wherein said main bit lines are lower in resistivity than said sub-bit lines.

23. The semiconductor memory device as claimed in claim 13, wherein each of said magnetic memory cells comprises a tunneling magnetoresistance element utilizing a tunneling magnetoresistance effect.

24. The semiconductor memory device as claimed in claim 13, wherein said semiconductor memory device comprises a magnetic random access memory device.

* * * * *